(12) United States Patent
Stanton

(10) Patent No.: US 6,214,497 B1
(45) Date of Patent: Apr. 10, 2001

(54) METHOD TO ELIMINATE SIDE LOBE PRINTING OF ATTENUATED PHASE SHIFT MASKS

(75) Inventor: William A. Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/342,229

(22) Filed: Jun. 29, 1999

(51) Int. Cl.⁷ .................................................. G03F 9/00
(52) U.S. Cl. ............................................................ 430/5
(58) Field of Search ............................ 430/5, 322, 323; 438/717

(56) References Cited

U.S. PATENT DOCUMENTS

| 5,244,759 | 9/1993 | Pierrat | 430/5 |
| 5,582,939 | 12/1996 | Pierrat | 430/5 |
| 5,591,550 | 1/1997 | Choi et al. | 430/5 |
| 5,601,954 | 2/1997 | Krivokapic et al. | 430/5 |
| 5,636,002 | 6/1997 | Garofalo | 430/5 |
| 5,672,450 | 9/1997 | Rolfson | 430/5 |
| 5,700,606 | * 12/1997 | Kobayashi et al. | 430/5 |
| 5,718,829 | 2/1998 | Pierrat | 430/5 |
| 5,795,682 | 8/1998 | Garza | 430/5 |
| 5,853,923 | 12/1998 | Tzu | 430/5 |
| 5,888,674 | * 3/1999 | Yang et al. | 430/5 |
| 6,057,066 | * 5/2000 | Hanawa | 430/5 |

* cited by examiner

Primary Examiner—S. Rosasco
(74) Attorney, Agent, or Firm—Dickstein Shapiro Morin & Oshinsky LLP

(57) ABSTRACT

The present invention provides a method of reducing side lobe printing using an attenuated phase shift mask that is designed to diminish the background of the attenuating portions that would otherwise be associated with a side lobe. The present invention reduces the magnitude of the side lobe by placing an opaque material on the partially light transmissive material so as to reduce or prevent the background of the attenuating portion.

37 Claims, 9 Drawing Sheets

METHOD TO ELIMINATE SIDE LOBE PRINTING OF ATTENUATED PHASE SHIFT MASKS

BACKGROUND OF THE INVENTION

1. Field of the Invention

The present invention relates to the field of photolithography used in fabricating semiconductor devices and, more particularly to a method of eliminating the side lobe printing of attenuated phase shift masks.

2. Description of the Related Art

In the manufacture of semiconductor wafers, photolithography is used to pattern various layers on a wafer. A layer of resist is deposited on the wafer and exposed using an exposure tool and a template such as a mask or reticle. During the exposure process a form of radiant energy such as ultraviolet light is directed through the reticle to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

An integral component of the photolithographic process is the reticle. The reticle includes the pattern corresponding to features (e.g., transistors or polygates) at a layer of the integrated circuit (IC) design. The reticle is typically a transparent glass plate coated with a patterned light blocking material such as, for example, Chromium. This type of reticle is typically referred to as a binary mask since light is completely blocked by the light blocking material and fully transmitted through the transparent glass portions.

There are problems with the binary mask. Light passing through the edge of a pattern within the mask (e.g., the boundary between a light blocking region and a transparent region) is oftentimes diffracted. This means that instead of producing a very sharp image of the edge on the resist layer, some lower intensity light diffracts beyond the intended edge boundary and into the regions expected to remain dark. Hence, the resultant feature shapes and sizes deviate somewhat from the intended IC design. Since integrated circuit manufacturers have continued to reduce the geometric size of the IC features, this diffraction produces wafers with incomplete or erroneous circuit patterns.

Attenuated phase shift masks (PSMs) have been used to overcome the diffraction effects and to improve the resolution and depth of images projected onto a target (i.e., the resist covered wafer). Attenuated PSMs utilize partially transmissive regions instead of the light blocking regions used in binary masks. The partially transmissive regions typically pass (i.e., do not block) about three to eight percent of the light they receive. Moreover, the partially transmissive regions are designed so that the light that they do pass is shifted by 180 degrees in comparison to the light passing through the transparent (e.g., transmissive) regions. Thus, some of the light spreading outside of the transparent region defined by the PSM pattern edge destructively interferes with light passing from the partially transmissive regions. This way, the detrimental effects caused by diffraction may be controlled.

FIG. 1a illustrates a portion of a conventional attenuated phase shift mask 10. The mask 10 includes a transparent portion 12 that permits transmission of radiant energy, such as ultra violet light, and phase shifting or attenuating portions 14 that only permit transmission of about three to eight percent of the light they receive. Also, the attenuating portions 14 phase shift any light they pass by 180 degrees. The attenuating portions 14 contain a single pattern or opening corresponding to a desired IC feature and is referred to herein as feature opening 16 (since a feature of the IC design will be produced from this opening in the attenuating portions 14).

FIG. 1b is a graph 20 illustrating the electric field amplitude, with respect to distance, present at a wafer being processed with the conventional attenuated phase shift mask 10 of FIG. 1a. As shown in the graph 20, the electric field profile actually contains three components: the first component 22, which is in phase with the light passing through the feature opening 16, and the second and third components 24, 26, which are 180 degrees out of phase with the light passing through the feature opening 16.

FIG. 1c is a graph 30 illustrating the light intensity amplitude, with respect to distance, present at a wafer being processed with the mask 10 of FIG 1a. As known in the art, intensity of the light passing through the attenuated phase shift mask 10 (FIG. 1a) is proportional to the electric field energy squared (i.e., I $E^2$). As shown, the intensity profile includes a first component 32 corresponding to the feature opening 16 (FIG. 1a). This first component 32 is desired since it corresponds to a feature of the IC design. However, the intensity profile also includes two other components 34, 36 which are not desired. These components 34, 36 are the combination (sum) of the diffraction of the 180 degrees phases of the components 24, 26 (FIG. 1b) and the approximate six percent background of the attenuating portions 14 of the mask 10 (FIG. 1a). These components are known in the art as side lobes and may corrupt the desired feature or cause undesired features to be etched into the wafer (known in the art as side lobe effects).

FIGS. 1a–1c illustrate a simple mask 10 with only one feature opening 16. As known in the art, the side lobe effect becomes more pronounced as the spacing between the IC features decreases. That is, when features are designed close to each other, which is the current trend, the electric field and intensity components associated with the side lobes of each feature begin to overlap and add-up. This causes side lobes of greater amplitude and increases the side lobe effect. Sometimes, the amplitude of these "additive" side lobes is greater than the amplitude of the desired features, which further corrupts the fabrication process.

There is a need to eliminate side lobes from being printed from an attenuated phase shift mask. In theory, the light forming a side lobe can be eliminated by light that is 180 degrees out of phase with the side lobe light. One attempt at eliminating the side lobes, has been to manually place additional transparent openings in the attenuated phase shift mask at locations where it is believed that side lobes may be printed. The additional openings would be sized and formed in the reticle so that they will pass the proper amount of out of phase light to cancel the side lobe. This manual process, however, is extremely time consuming. In addition, since the feature size has dramatically decreased, and the number of features within the IC design has greatly increased, it is not feasible, and virtually impossible, to manually eliminate all of the side lobes particularly for a very large scale IC. Thus, wafers may still be ruined with a manually altered mask.

Other methods have used design rule algorithms to place the additional openings at locations where the rules detect that side lobes would print. Rules take the form of "if the distance between two features is X then a side lobe would print at Y." Developing the design rules, however, is very time consuming. In addition, an IC design may incorporate numerous unique environments (e.g., different placements of the IC features) and thus, the resulting attenuated phase shift mask may be very complex. Moreover, the likelihood that a side lobe will form and where it will form is dependent upon the configuration and proximity of adjacent IC features. It would be very time consuming and practically impossible to develop rules to locate all of the potential side lobes (and their locations) for the many possible feature environments within a complex IC design. That is, this method could not handle the full IC chip design.

Accordingly, there is a need and desire for a method of eliminating side lobe printing from an attenuated phase shift mask that is less time consuming then other attempts to eliminate side lobe printing. Moreover, there is a need and desire for a method of eliminating side lobe printing from an attenuated phase shift mask based on a full integrated circuit (IC) chip design.

SUMMARY OF THE INVENTION

The present invention provides a method of reducing side lobe printing from an attenuated phase shift mask that is less time consuming then other attempts to eliminate side lobe printing.

The present invention provides a method of reducing side lobe printing using an attenuated phase shift mask that is designed to diminish the background of the attenuating portions that would otherwise be associated with a side lobe. The present invention reduces the magnitude of the side lobe by placing an opaque material on the partially light transmissive material so as to reduce or prevent the background of the attenuating portion. This prevents light from passing through the partially light transmissive material and adding to the side lobe energy. By reducing this component of the side lobe energy, it is possible to keep the side lobe energy at or below the printing threshold and prevent unwanted side lobes from printing.

BRIEF DESCRIPTION OF THE DRAWINGS

The foregoing and other advantages and features of the invention will become more apparent from the detailed description of the preferred embodiments of the invention given below with reference to the accompanying drawings in which:

FIGS. 1b and 1c illustrate electric field and light intensity amplitude vs. distance plots experienced at a wafer being processed with the conventional attenuated phase shift mask of FIG. 1a;

DETAILED DESCRIPTION OF PREFERRED EMBODIMENTS

Figure 1A:
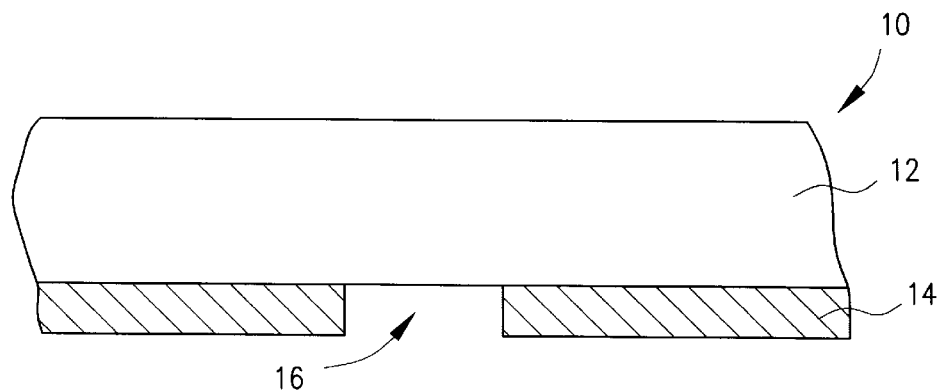
FIG. 1a illustrates a portion of a conventional attenuated phase shift mask.

Attenuated phase shift mask technology is needed for processing margins at the present contact sizes of 0.15 and 0.13 $\mu$m technologies. The problem with the use of conventional mask (including reticle) material is that due to transmissions in areas which are not suppose to print, there are certain pitches and combinations of contacts in which diffraction lobes superimpose and thus print (image) in the resist. The present invention provides a method of reducing side lobe printing using an attenuated phase shift mask that is designed to diminish the background light that would otherwise pass through the partially light transmissive material and be associated with a side lobe. The present invention reduces the magnitude of the side lobe by placing an opaque material on the partially light transmissive material so as to reduce or prevent the background of the attenuating portion.

The layout (design) is first determined to identify potential side lobe printing problems that would otherwise exist if only a transmissive substrate layer (also referred to as transparent material) and a partially light transmissive material were provided. As shown in FIG. 2, a transparent material 200 is coated with a partially light transmissive material 210. The transparent material is preferably Quartz but may be any other well-known transparent material suitable for making photomasks, including soda-lime glass, borosilicate glass, or similar natural or synthetic substances. The transparent material is preferably 250 mils thick. All references to thickness herein refer to the thickness in the vertical axis when viewing a cross section and are approximate. It is expressly contemplated that varying thickness may be used and that the thickness of any material may be non-uniform.

The partially light transmissive material 210 is applied to the transparent material 200 through any well-known process such as vapor deposition or sputtering. The partially light transmissive material 210 is preferably Molybolium Silicide (MoSi) but may also include other well known partially light transmissive materials. The MoSi is preferably 945 angstroms thick. Partially light transmissive materials 210 are known to transmit between two and fifteen percent of the light radiation. The present invention preferably utilizes partially transmissive materials 210 and/or thickness of the same which transmits between six and eight percent of incident light radiation.

As shown in FIGS. 2a–2d, the transparent material 200 and partially light transmissive material 210 are then coated with an opaque material 220, such as Chromium (which may include Chrome or Chromium alloys). Other well known opaque materials and well-known substitutes may be used instead of Chromium. The opaque material is preferably 1000 angstroms thick.

A resist 215 is patterned by a write tool (not shown) and the resist is used to subsequently developed the reticle. A dry etching process is used to remove the opaque material 220 and partially light transmissive material 210 in open (exposed) areas 216. A resist 216 is coated on the reticle again to write opaque (chrome) side lobe inhibiting regions 221. The resist 216 is developed and the opaque material 220 is removed in the areas where the resist 216 was exposed.

It is expressly contemplated that the opaque material 220 may include an opaque/partially light transmissive material that is less light transmissive that the partially light transmissive material 210. As the role of the opaque material 220 is to diminish the background of the attenuating portions that would otherwise be associated with a side lobe, the present invention does not need to eliminate the background of the attenuation portion but reduce it a sufficient amount so as to reduce or prevent the background light from being transmitted through the partially light transmissive material 210 above the unwanted side lobe.

Partially light transmissive materials 210 are designed so that the light that they do pass is shifted by 180 degrees in comparison to the light passing through the transparent (e.g., transmissive) material 200. Thus, when feature openings are formed some of the light spreading outside of the transparent region defined by the PSM pattern edge destructively interferes with light passing from the partially transmissive regions. This way, the detrimental effects caused by diffraction may be controlled. Partially transmissive material 210 can however create side lobes.

Figure 1B:
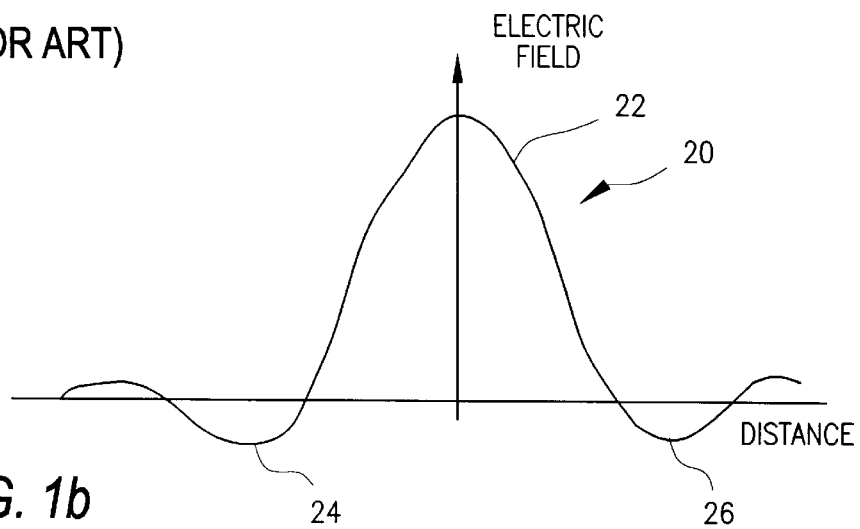
Figure 1C:
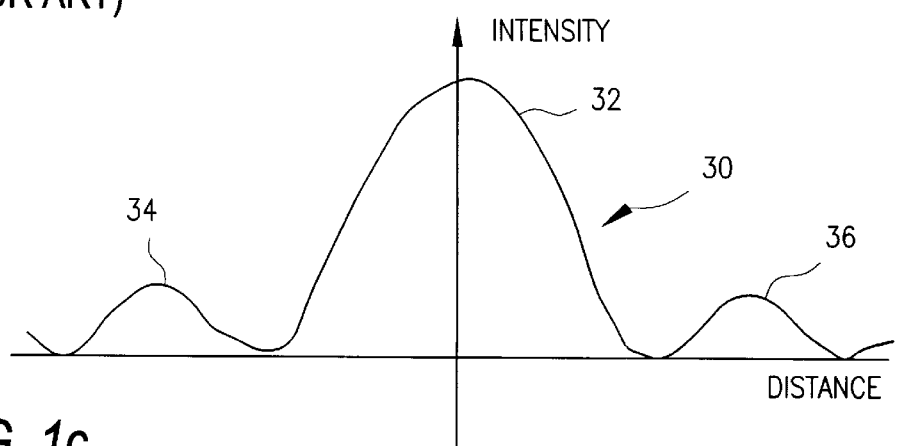
Figure 2A:
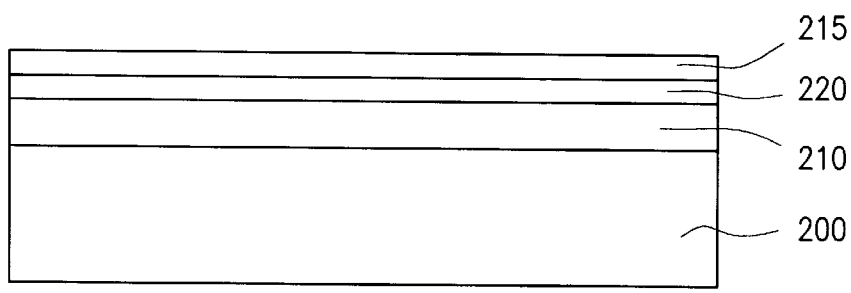
FIGS. 2a–2d are schematic side views of an attenuated phase shift mask with opaque material added to reduce unwanted side lobes.
Figure 2B:
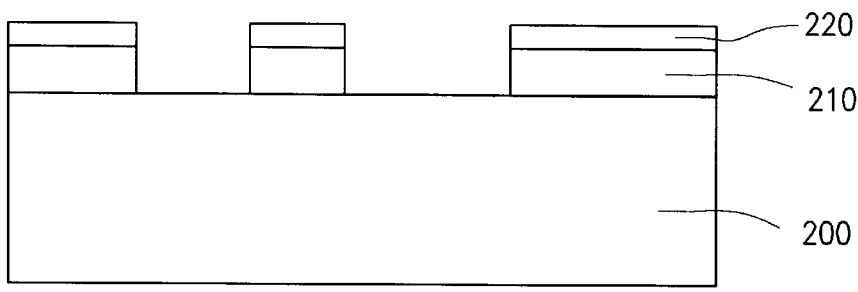
Figure 2C:
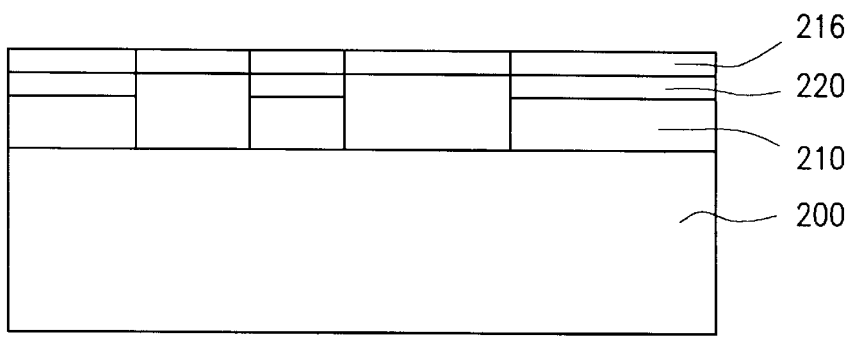
Figure 2D:
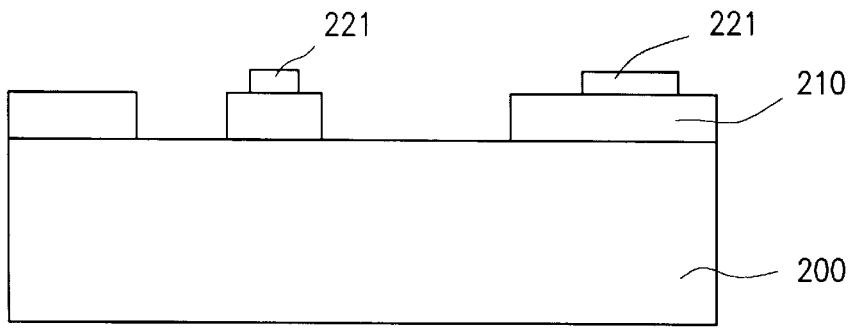

As shown in FIG. 1, the intensity profile includes a first component 32 corresponding to the feature opening 16 (FIG. 1a). The intensity profile also includes two other components 34, 36 which are not desired. These components 34, 36 are the combination (sum) of the diffraction of the 180 degrees phases of the components 24, 26 (FIG. 1b) and the approximate six percent background of the attenuating portions 14 of the mask 10 (FIG. 1a). The present invention reduces the magnitude of the side lobe by placing an opaque material on the partially light transmissive material to reduce or prevent light from passing through the partially light transmissive material 210 and contributing to the side lobe. By reducing one of the contributing factors to the side lobe's magnitude, the side lobe's energy may be reduced a sufficient amount so that it no longer prints. This permits integrated circuit manufacturers to continue to reduce the geometric size of the IC features.

Figure 3:
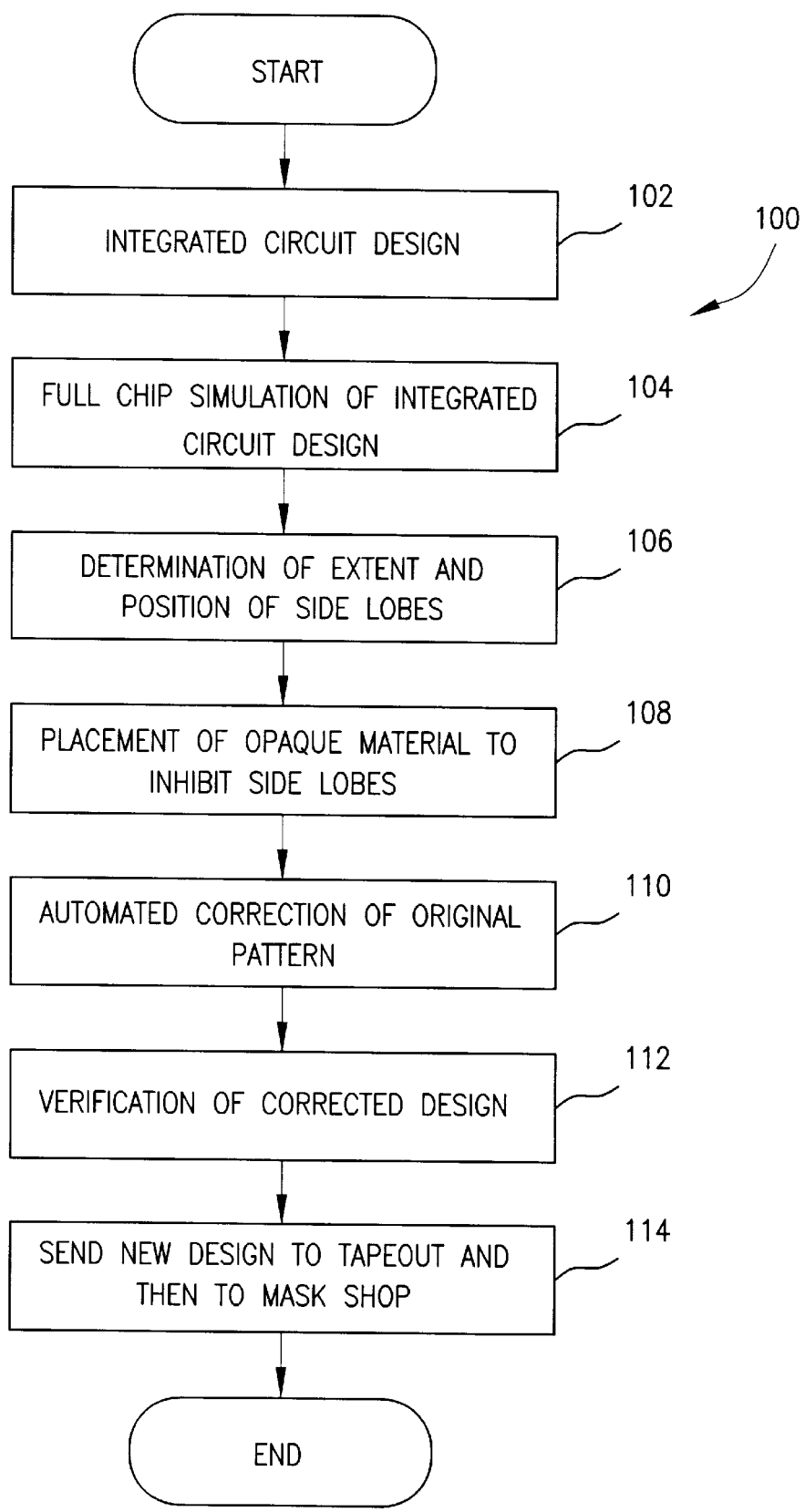
FIG. 3 illustrates an exemplary process for eliminating side lobe printing from attenuated phase shift masks in accordance with the present invention.

FIG. 3 illustrates an exemplary process 100 for eliminating side lobe printing from attenuated phase shift masks. Process 100 is also described in co-pending, commonly owned and invented U.S. Pat. application No. 08/285,696 filed Apr. 5, 1999, titled: METHOD TO ELIMINATE SIDE LOBE PRINTING OF ATTENUATED PHASE SHIFT MASK; Inventors: Baggenstoss & Stanton), the contents of which are incorporated herein by reference. The process 100 is preferably implemented in software and executed on at least one computer system or workstation. As will become apparent, the process 100 can be executed on several computer systems or workstations to reduce the time required to execute the process 100.

Briefly, the process 100 will input a full IC chip design and simulate the various environments (i.e., placement of IC features, such as transistors) to see how the features within each environment will print from an attenuated phase shift mask created in accordance with the input design. The simulation of each environment also determines the extent and locations of unwanted side lobes that would also print based from the mask based on the input design. Once the side lobes are determined, the process 100 incorporates opaque material into the input design. Opaque material is placed at a side lobe location, such as directly over the side lobe, and is designed to reduce the radiant energy transmitted directly through the partially light transmissive material that would otherwise increase the magnitude of the side lobe.

The process 100 then performs an optimal proximity correction on the modified input design (only on the desired IC features) to ensure that desired features of each environment print as originally desired. The process 100 then simulates each environment to verify that its features will print as originally desired and without side lobes. Once verified, the modified input design is used to create an attenuated phase shift mask, with side lobe reducing opaque regions, that prints the desired features. If not verified, the process 100 may be rerun to reduce or eliminate remaining side lobes.

At step 102, the process 100 inputs a full IC chip design. It is desirable for the design to be contained in the industry standard GDSII format, but it should be appreciated that any other suitable format could be used. The design does not have to be created on the same computer system or workstation that is executing the process 100. For example, the design could be created at a first computer workstation and then transferred to the computer executing the process 100 via a computer readable storage medium, network connection, electronic mail (e-mail), etc. The input IC design will contain one mask level and will typically contain polygons corresponding to the numerous feature configurations. That is, it will contain a single layer of features within the full IC design, which may contain several layers, that can be printed from one attenuated phase shift mask.

At step 104, the input full IC chip design is simulated to determine how the features in the design would print from a mask created in accordance with the design. Here, the hierarchy of the design is broken-up into different environments (i.e., placement of the features within the design) and then a model based simulation is performed on each environment to determine what a wafer being processed by a mask created in accordance with the input design would look like. That is, it is possible to simulate the printed contours of the features within each environment. These steps are performed using a conventional behavioral model based simulation tool, such as PROTEUS by AVANT!, that is modified to identify the different environments. Moreover, once the full IC chip design is broken down into individual environments, each environment can be distributed to another computer system or workstation executing the process 100 of the present invention and thus, multiple environments can be processed in parallel, which greatly increases the speed of the process 100. Alternatively, the process 100 can be initiated on several different computer systems or workstations using the same full IC chip design input, but once the different environments are detected at step 104, the user can select different environments for processing by each computer system (therefore, there would not be a need to transfer an environment to a different computer workstation).

Figure 4:
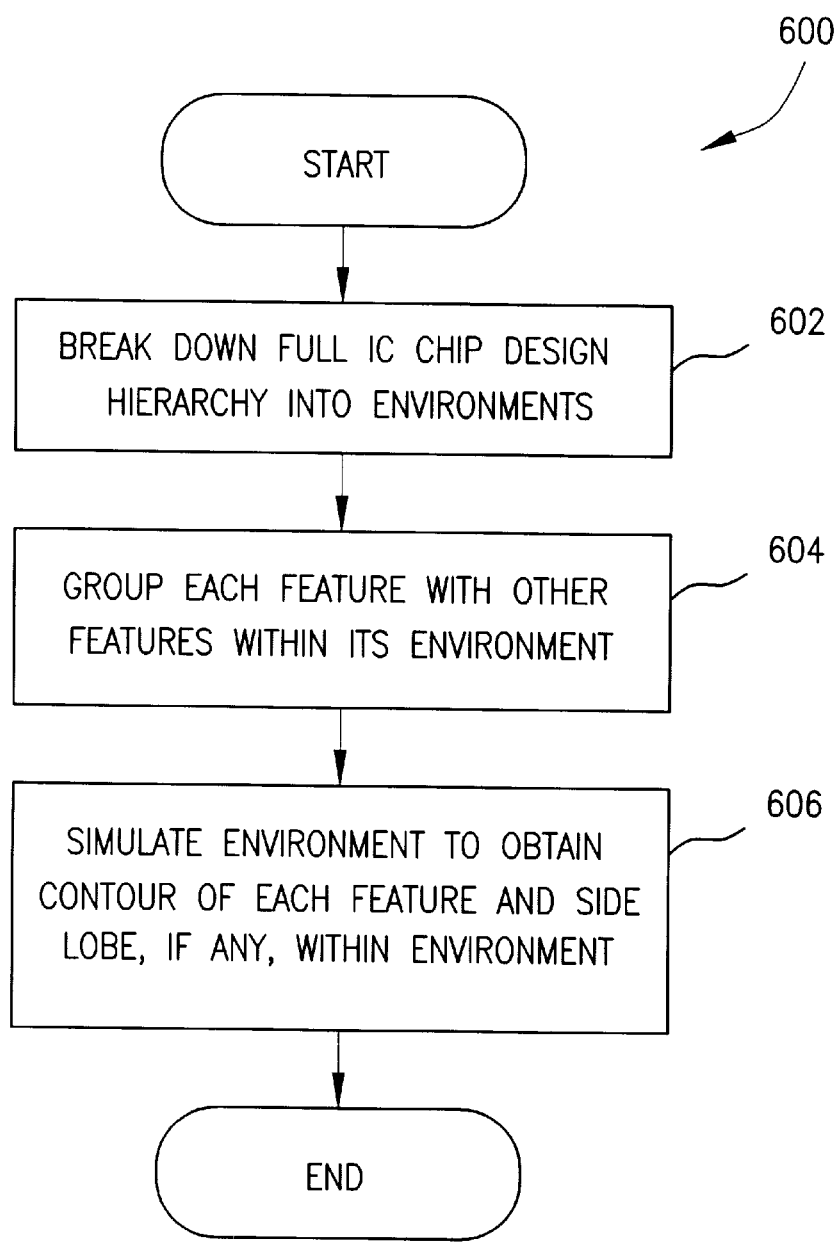
FIG. 4 illustrates a verified contour map of an environment containing side lobe inhibitors according to the process illustrated in FIG. 3.

Referring to FIG. 4, a description of an exemplary process 600 for simulating an environment of the IC design to obtain a contour of the features and side lobes within the environment now follows. Initially, the original input design hierarchy is modified based on the environment of each feature (step 602). Each feature is then grouped with the other cells of its environment (step 604). At step 606, the environment is simulated (as described below) to obtain a contour of the features within the environment. The contour represents what each feature within an environment would actually look like on the wafer being processed.

The model based simulation may be performed in many ways. A first way would be to use an optical model. An optical model uses the mathematics of image formation to produce the simulated contour pattern. Different parameters, such as the wavelength of light and numerical aperture, defocus, etc. can be set to match the settings of the exposure equipment used to process the wafer.

A second method would use a process model. The process model utilizes actual data from an exposed wafer, from either the resist pattern or the pattern after the wafer has been etched. This "real" data is used to create an empirical model which is adjusted so that the results of the simulation match the experimental data. This approach allows the software of the present invention to accurately predict the response of a given pattern without having a theoretical understanding of everything that takes place in transferring the mask pattern onto the wafer. It should be noted that the optical and process models will both be capable of generating contours for side lobes if they would be printed based on the input design and their respective simulations.

FIGS. 5a–5d illustrate exemplary simulation contour maps of four different environments 1200, 1220, 1240, 1260 created during step 104 of the process (FIG. 3). The first environment 1200 contains squares 1202 that represent features of the input IC design and circles 1204 that represent the contours of the features represented by the squares 1202. In addition, the first environment 1200 contains other contours 1206 which are not contained within a square or polygon. These other contours 1206 represent unwanted side lobes that would print within the environment 1200 from a mask based on the input IC design. All of the contours 1204, 1206 were obtained from one of the simulation models as described above with reference to FIG. 3. It is desirable, for the present invention to eliminate the side lobe contours 1206 yet keep the contours 1204 of the IC features 1202.

Similarly, the second environment 1220 contains squares 1222 that represent features of the input IC design and circles 1224 that represent the contours of the features represented by the squares 1222. In addition, the second environment 1220 contains other contours 1226 which are not contained within a square or polygon. These other contours 1226 represent unwanted side lobes that would print within the environment 1220 from a mask based on the input IC design. The third environment 1240 contains squares 1242 that represent features of the input IC design and circles 1244 that represent the contours of the features represented by the squares 1242. In addition, the third environment 1240 contains other contours 1246 which are not contained within a square or polygon. These other contours 1246 represent unwanted side lobes. Likewise, the fourth environment 1260 contains squares 1262 that represent features of the input IC design and circles 264 that represent the contours of the features represented by the squares 1262. In addition, the fourth environment 1260 contains other contours 1266 which are not contained within a square or polygon. These other contours 1266 represent unwanted side lobes.

All of the feature contours 1204, 1224, 1244, 1264 and side lobe contours 1206, 1226, 1246, 1266 within the four environments 1200, 1220, 1240, 1260 were obtained from one of the simulation models described above with reference to FIG. 3 (step 104). It is desirable, for the present invention to eliminate the side lobe contours 1206, 1226, 1246, 1266 yet keep the feature contours 1204, 1224, 1244, 1264 of each environment. It should be noted that the side lobe contours 1206, 1226, 1246, 1266 of each environment 1200, 1220, 1240, 1260 differ from each other since the features of 1202, 1222, 1242, 1262 of each environment 1200, 1220, 1240, 1260 are placed differently. These are but a few of the many possible feature environments that could be incorporated into a single full IC chip design and a further example as to why the manual and rules based algorithm methods would be inefficient to eliminate side lobes completely. Moreover, these methods do not break down the IC chip design into environments, making it more difficult to detect and eliminate side lobes.

Figure 5A:
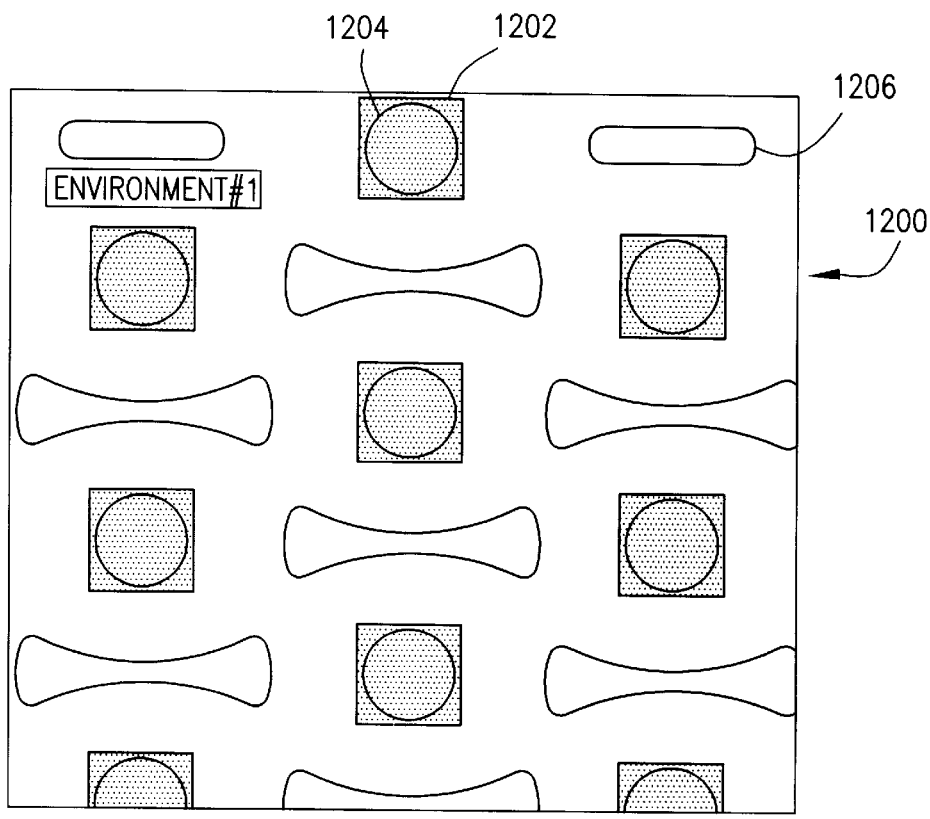
FIGS. 5a–5d illustrate exemplary simulation contour maps of different environments within an integrated (IC) design created within the process illustrated in FIG. 2.
Figure 5B:
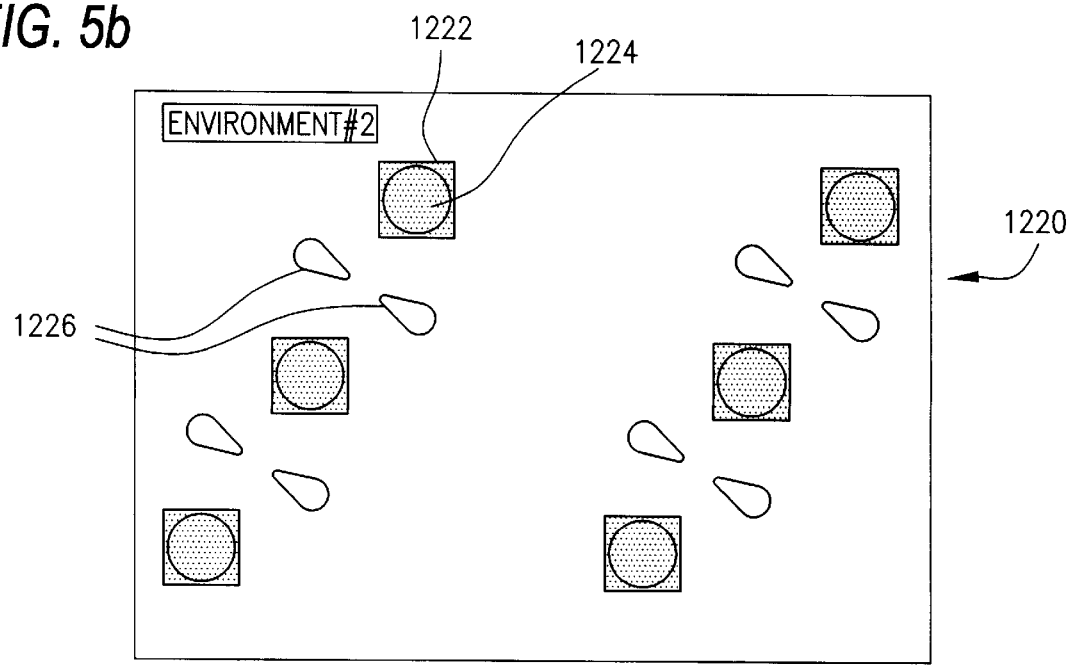
Figure 5C:
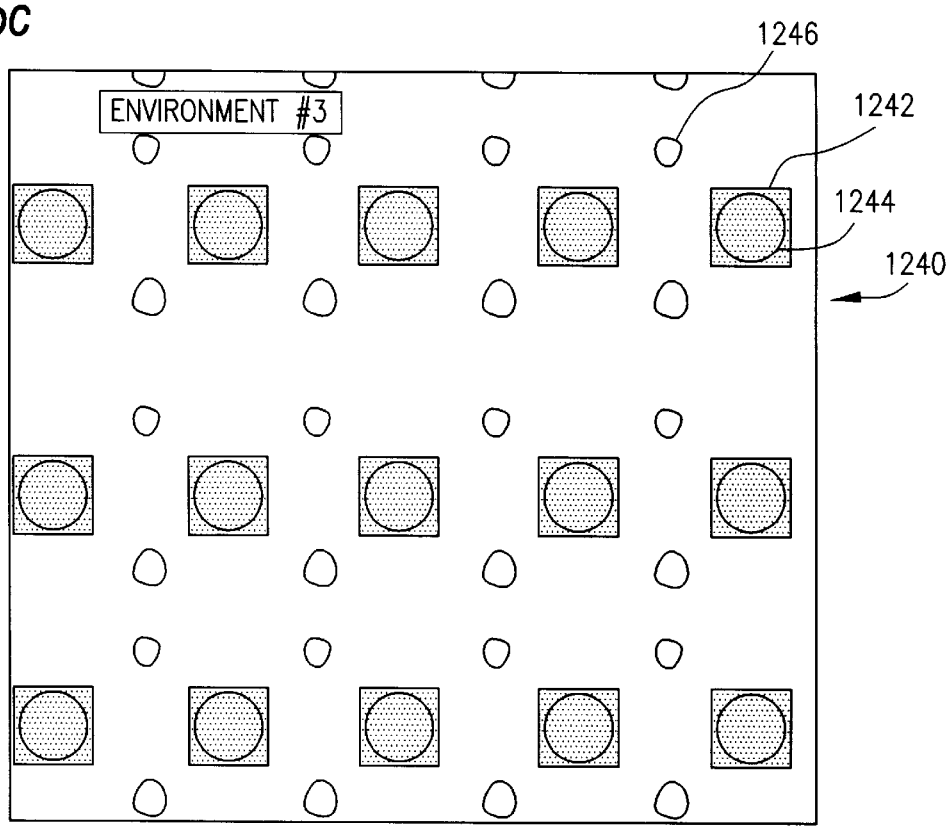
Figure 5D:
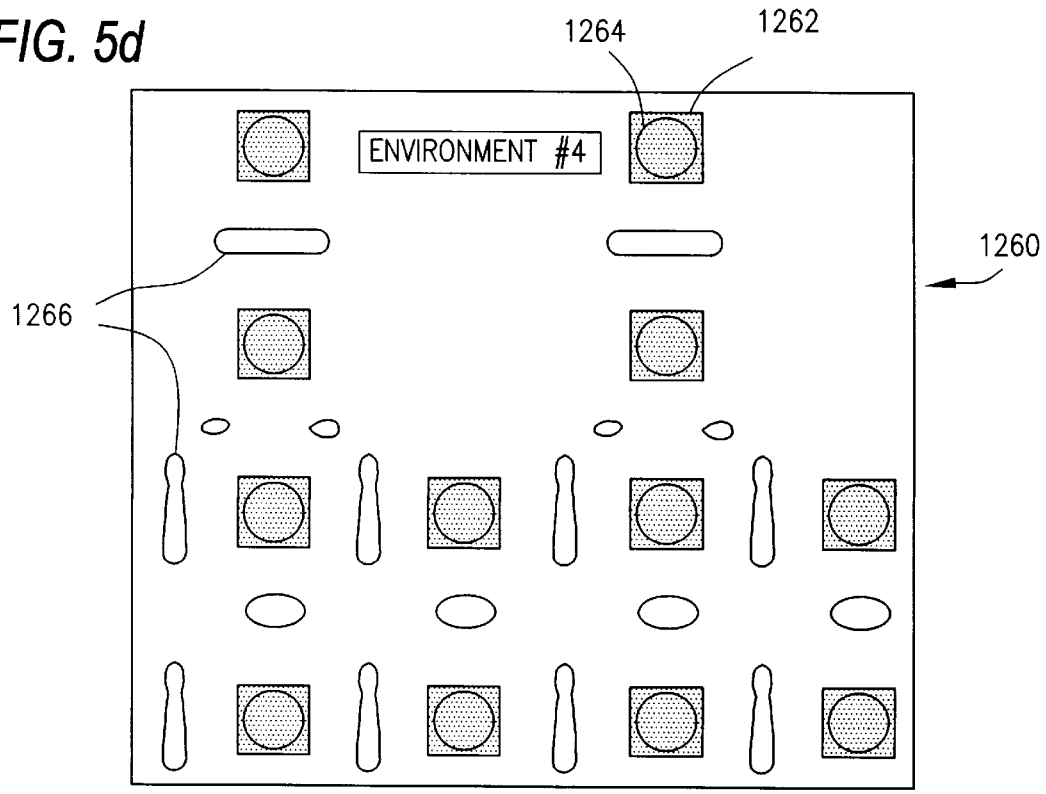

Referring to FIGS. 3 and 5c, the process 100 continues at step 106 to determine the extent and location of any side lobes within the environments. For convenience purposes only, the remaining description will illustrate how the process 100 eliminates side lobes from printing within the third environment 1240. As noted above, the other environments 1200, 1220, 1260 (FIGS. 5a, 5b and 5d) could be processed in parallel on other computer workstations if desired. At step 106, the extent and location of side lobes within the third environment 1240 is determined. To determine the extent and location of the side lobes, the behavioral based simulation tool is modified to detect any contours 1246 that occur outside of the feature squares 1242. These contours 1246 are marked as side lobes, their extent and location are recorded.

Figure 6:
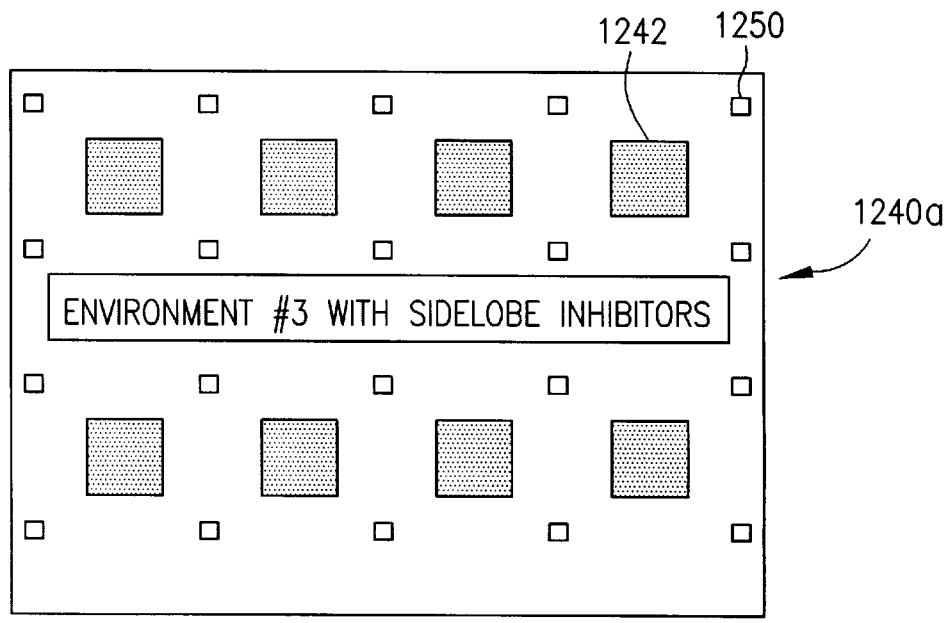
FIG. 6 illustrates an exemplary map of an environment that has been modified to include side lobe inhibitors according to the process illustrated in FIG. 3.

Referring to FIGS. 3 and 6, the process 100 places opaque material 1250 within the third environment at locations corresponding to the side lobe contours 1246 illustrated in FIG. 5c to form a modified third environment 1240a. The opaque material 1250 is inserted into the input design and thus, form a modified input design. Since side lobes are created from light passing through the partially transmissive portions of the mask, the opaque material 1250 can reduce the radiant energy of the side lobes below the printing threshold. Therefore, the opaque material 1250 serves as a side lobe inhibitor when incorporated into the attenuated phase shift mask incorporating the modified third environment 1240a.

Figure 7:
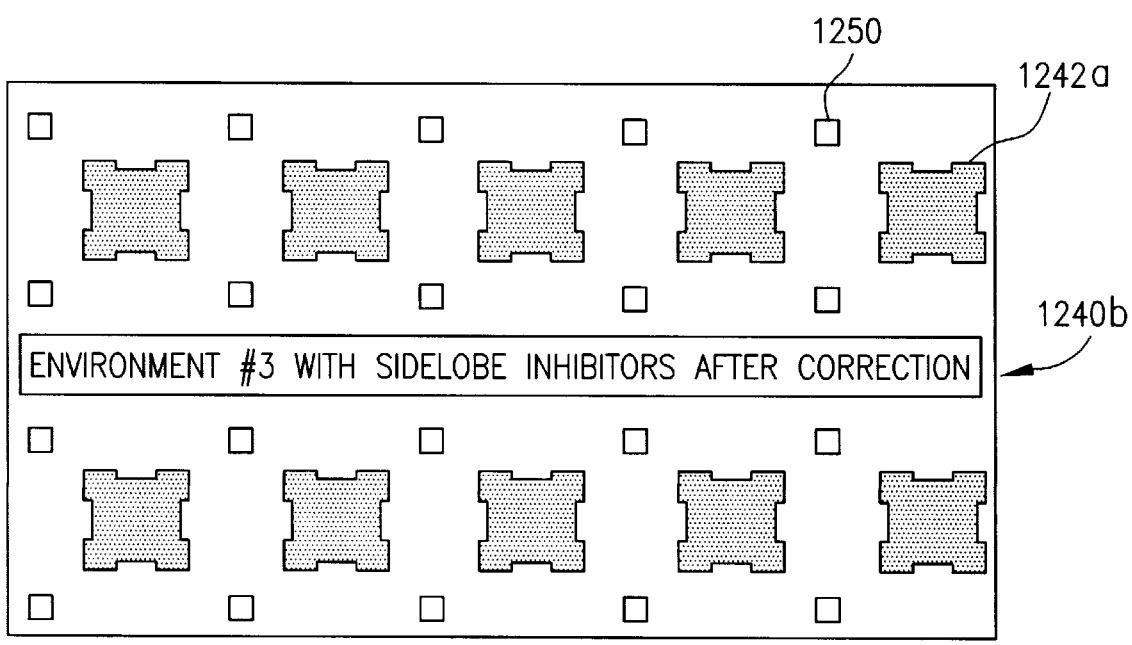
FIG. 7 illustrates an exemplary map of an environment containing side lobe inhibiting opaque material in which desired IC features have undergone optimal proximity correction (OPC) in accordance with the process illustrated in FIG. 3.

After step 108, the process 100 has created a modified third environment 1240a that should print without side lobes. However, the process 100 has altered the original input design of the third environment 1240 (FIG. 5c) and may have also altered the printing (i.e., contours) of the IC features. Thus, the process 100 must ensure that the IC features print as originally desired. Referring to FIGS. 3 and 7, the process 100 performs an automated correction based on the original input design (step 110). The automated correction is performed by an optimal proximity correction (OPC) method on the modified third environment (via the modified input design) to form a corrected third environment 1240b. To perform the OPC, one of the simulation models described above with reference to step 104 is used to obtain the desired feature contours 1244 (as illustrated in FIG. 5c) by modifying the feature squares 1242 (FIG. 5c) until the desired contours 1244 of each feature is obtained. It must be noted that the side lobe inhibitors do not undergo OPC. As illustrated in FIG. 5, the corrected third environment 1240b now contains feature polygons 1242a (as opposed to the squares 242 illustrated in FIG. 5c) and auxiliary features 250. The feature polygons 1242a are inserted into the input design and thus, form a corrected modified input design.

At this point, an attenuated phase shift mask implementing the corrected third environment 1240b (via the corrected modified input design) should print the IC features as originally designed, but most importantly, should not print any side lobes. To be sure, however, the corrected third environment 1240b is verified.

Figure 8:
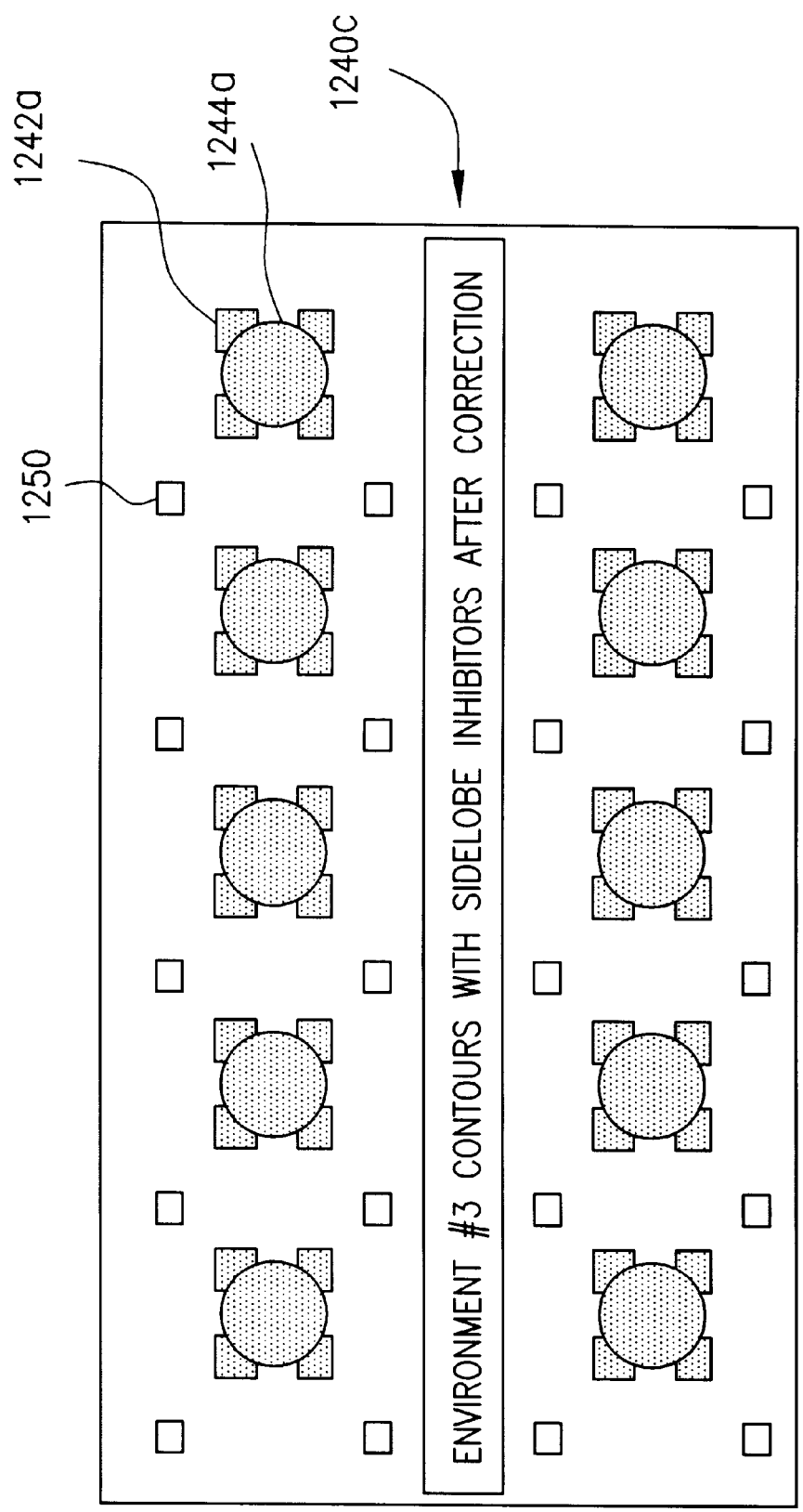
FIG. 8 illustrates an exemplary process for simulating an environment of an IC design to obtain a contour of the features and side lobes within the environment.

Referring to FIGS. 3 and 8, the process 100 verifies the corrected third environment by simulating the environment (as performed above with reference to step 104) to form a verified third environment 1240c (step 112). As shown in FIG. 8, the verified third environment 1240c only contains contours 1244a within the corrected feature polygons 1242a. The contours 1244a have the same shape and size as the contours 1244 (FIG. 5c) of the original input design. Thus, the features of the original input design will be printed by an attenuated phase shift mask implementing the verified corrected design of the third environment 1240c (via the corrected modified input design). No side lobe contours are illustrated in the verified third environment 1240c. Thus, the side lobe contours 1246 (FIG. 5c) that would have printed had the process 100 of the present invention not been executed, have been eliminated. If, however, it is determined at step 112 that side lobes would print, the process 100 could continue at step 108 so that more auxiliary features could be incorporated into the design (and steps 108–112 would be repeated).

At step 114, after all of the environments contained within the original full IC chip design have been simulated, modified, corrected and verified (steps 104–112), the modified input full IC chip design is sent to a tapeout (i.e., formatted so that a mask writing tool can input the design) and then sent to a mask shop, where an attenuated phase shift mask will be created that implements the side lobe free IC chip design.

Figure 9:
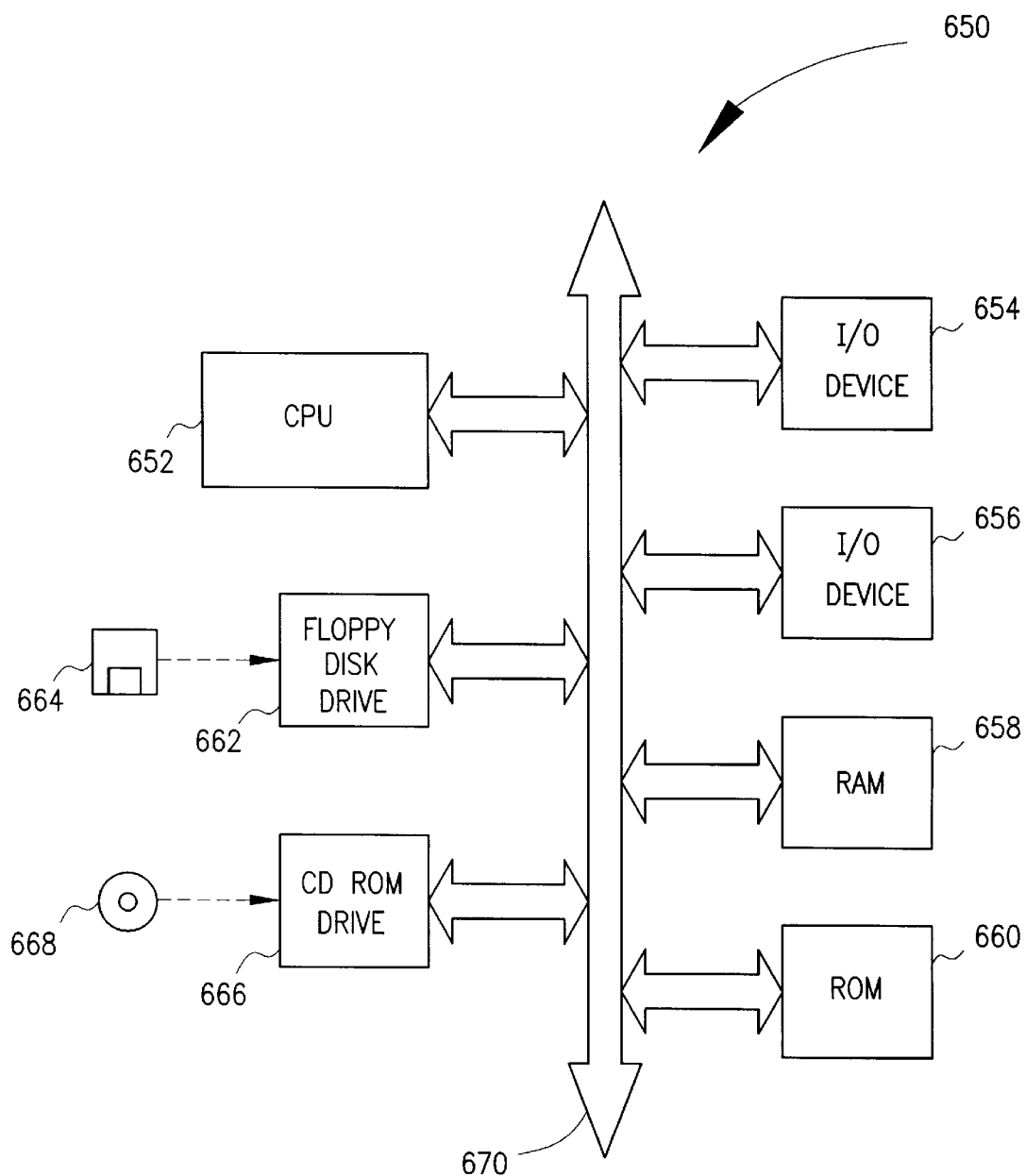
FIG. 9 illustrates an exemplary computer system in which the process of FIG. 3 may be implemented.

FIG. 9 illustrates an exemplary computer system 650 in which the process 100 of FIG. 3 may be implemented. The system 650 includes a central processing unit (CPU) 652 that communicates with an input/output (I/O) device 654 over a bus 670. A second I/O device 656 is illustrated, but not necessary to practice the present invention. The computer system 650 also includes random access memory (RAM) 658, read only memory (ROM) 660 and may include peripheral devices such as a floppy disk drive 664 or a compact disk read only memory (CD-ROM) drive 666 that also communicate with the CPU 652 over the bus 670. It must be noted that the exact architecture of the computer system 650 is not important and that any combination of computer compatible devices may be incorporated into the system 650 as long as the process of the present invention can be executed. In a preferred embodiment, the computer system 650 is a UNIX based workstation. Moreover, the program implementing the process of the present invention may be stored in ROM 608, a CD-ROM 668, floppy disk 664, hard disk drive or any other medium capable of storing a computer program and data required by the program. In addition, the computer program embodying the process of the present invention may be downloaded, for example, from a server computer or another computer connected to the computer system 650. As stated earlier, the process of the present invention can be executed in a distributed manner over several computer systems 650, whether connected by a network or not, to process different environments of the full IC chip design in a parallel fashion.

In addition, it is noted that a computer system as shown in FIG. 9 can have one or more of the devices shown therein, for example, RAM 658, fabricated using masks formed in accordance with the present invention.

The present invention is capable of eliminating side lobe printing from an attenuated phase shift mask by selectively incorporating the use of opaque materials to reduce the magnitude of unwanted side lobes below the printing threshold. By organizing the IC design into environments, the present invention can handle a very large full IC chip design quickly and accurately unlike prior side lobe elimination methods. Moreover, by operating on different environments of the IC design, the present invention can distribute environments to other computer systems so that the environments can be processed in a parallel manner.

While the invention has been described in detail in connection with the preferred embodiments know at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed is as new and desired to be protected by Letters Patent of the United States is:

1. A method of forming a phase shift mask for use in wafer fabrication, said method comprising the steps of:
coating a transparent substrate layer with a partially light transmissive material; and
coating said partially light transmissive material with an opaque material in a first side lobe region corresponding to a background of attenuating portions that would otherwise be associated with a side lobe, wherein a coating pattern of said partially light transmissive material is determined by:
modifying a circuit design corresponding to an original pattern of said partially light transmissive material to include the opaque material in the first side lobe region, and
correcting the design having the opaque material placed therein to form a corrected design corresponding to the coating pattern and to ensure that circuit features of the coating pattern print in accordance with the original pattern and without side lobes.
2. The method as claimed in claim 1 wherein said transparent substrate layer comprises Quartz.
3. The method as claimed in claim 1 wherein said partially light transmissive material comprises MoSi.
4. The method as claimed in claim 1 wherein said opaque material comprises Chromium.
5. The method as claimed in claim 1 wherein said transparent substrate layer is 250 mils thick.
6. The method as claimed in claim 1 wherein said partially light transmissive material is 945 angstroms thick.
7. The method as claimed in claim 1 wherein said opaque material is 1000 angstroms thick.
8. The method as claimed in claim 1 wherein said partially light transmissive material transmits between six and eight percent of light radiation.
9. The method as claimed in claim 1 further comprising forming at least one feature opening in said partially light transmissive material.
10. An attenuated phase shift mask comprising:
transparent material;
a partially light transmissive material disposed on said transparent material so as to define a pattern on said transparent material; and
an opaque material disposed on areas of said partially transmissive material where if light passed through said areas side lobe printing would otherwise occur,
wherein said pattern of said partially light transmissive material corresponds to an original pattern of a circuit design that has been modified to include the opaque material and corrected to form the pattern and to ensure that circuit features of the pattern print in accordance with the circuit design and without side lobes.

11. The attenuated phase shift mask as claimed in claim 10 wherein said transparent material comprises Quartz.

12. The attenuated phase shift mask as claimed in claim 10 wherein said partially light transmissive material comprises MoSi.

13. The attenuated phase shift mask as claimed in claim 10 wherein said partially light transmissive material transmits between six and eight percent of light radiation.

14. The attenuated phase shift mask as claimed in claim 10 wherein said opaque material comprises Chromium.

15. The attenuated phase shift mask as claimed in claim 10 further comprising at least one feature opening formed in said partially light transmissive material.

16. The attenuated phase shift mask as claimed in claim 10 further comprising at least one feature opening formed in said partially light transmissive material and said opaque material.

17. The attenuated phase shift mask as claimed in claim 10 further comprising a first feature opening formed in said partially light transmissive material and a second feature opening formed in said partially light transmissive material and said opaque material.

18. The attenuated phase shift mask as claimed in claim 10 wherein said transparent substrate layer is 250 mils thick.

19. The attenuated phase shift mask as claimed in claim 10 wherein said partially light transmissive material is 945 angstroms thick.

20. The attenuated phase shift mask as claimed in claim 10 wherein said opaque material is 1000 angstroms thick.

21. A computer implemented method of eliminating side lobe printing from a phase shift mask implementing a circuit design, comprising the steps of:

inputting the circuit design, the design comprising circuit features to be printed from the mask;

organizing the input design into a plurality of feature environments;

simulating the environments to determine contours of the environments;

determining from the contours if there are any side lobes within the environments;

placing an opaque material within the environments at a location of at least one determined side lobe; and correcting each environment having opaque material placed therein to form a corrected design and to ensure that circuit features of the corrected design print in accordance with the input circuit design, wherein the opaque material eliminates at least one side lobe printing from the mask.

22. The method of claim 21 wherein said simulating step is performed by determining how the environments would print from the mask based on a simulation model.

23. The method of claim 21 wherein the simulation model comprises an optical model.

24. The method of claim 21 wherein the optical model utilizes image data determined by settings of a tool used process a wafer with the mask to simulate the contours of the environments.

25. The method of claim 21 wherein the simulation model comprises a process model.

26. The method of claim 25 wherein the process model utilizes contour data from a processed wafer to simulate the contours of the environments.

27. The method of claim 21 wherein said determining step comprises:

determining whether a contour is associated with a circuit feature of the input design; and if a contour is not associated with a circuit feature, identifying the contour as a side lobe.

28. The method of claim 21 wherein the circuit features correspond to transparent regions within the mask.

29. The method of claim 21 further comprising the step of verifying the corrected design to ensure that side lobes do not print from the mask.

30. The method of claim 29 wherein said verifying step comprises:

simulating environments of the corrected design to determine contours of the environments; and determining from the contours if there are any side lobes within the corrected design.

31. The method of claim 30 wherein said step of simulating the corrected design is performed by determining how the environments of the corrected design would print from the mask based on a simulation model.

32. The method of claim 30 wherein the simulation model comprises an optical model.

33. The method of claim 32 wherein the optical model utilizes image data determined by settings of a tool to process a wafer with the mask to simulate the contours of the environments of the corrected design.

34. The method of claim 31 wherein the simulation model comprises a process model.

35. The method of claim 34 wherein the process model utilizes contour data from a processed wafer to simulate the contours of the environments of the corrected design.

36. The method of claim 21 wherein said correcting step comprises an optimal proximity correction of the circuit features based on the placement of the circuit features and the opaque material within the environments.

37. The method of claim 21 wherein multiple environments of the input design are processed in a parallel manner.

* * * * *

UNITED STATES PATENT AND TRADEMARK OFFICE
CERTIFICATE OF CORRECTION

PATENT NO.    : 6,214,497 B1                                      Page 1 of 1
DATED         : April 10, 2001
INVENTOR(S)   : William Stanton It is certified that error appears in the above-identified patent and that said Letters Patent is hereby corrected as shown below:

Column 2:
Line 23, "I E$^2$" should read -- I µ E$^2$ --.

Column 5:
Line 47, "08/285,696" should read -- 09/285,696 --.
Line 48, "filed" should read -- (filed --.

Signed and Sealed this

Eleventh Day of September, 2001

Attest:

NICHOLAS P. GODICI
Attesting Officer    Acting Director of the United States Patent and Trademark Office